United States Patent
Robotham

(10) Patent No.: US 7,469,317 B2
(45) Date of Patent: Dec. 23, 2008

(54) METHOD AND SYSTEM FOR CHARACTER STRING SEARCHING

(75) Inventor: Robert Elliott Robotham, Ottawa (CA)

(73) Assignee: Alcatel Lucent, Paris (FR)

( * ) Notice: Subject to any disclaimer, the term of this patent is extended or adjusted under 35 U.S.C. 154(b) by 287 days.

(21) Appl. No.: 11/519,071

(22) Filed: Sep. 12, 2006

(65) Prior Publication Data

US 2008/0065821 A1 Mar. 13, 2008

(51) Int. Cl.
*G06F 12/00* (2006.01)
(52) U.S. Cl. .......................... 711/118; 711/216
(58) Field of Classification Search ................. 711/108, 711/216, 220, 212; 365/49
See application file for complete search history.

(56) References Cited

U.S. PATENT DOCUMENTS

| 7,043,494 | B1 * | 5/2006 | Joshi et al. | 707/101 |
| 7,356,033 | B2 * | 4/2008 | Basu et al. | 370/392 |
| 7,366,830 | B1 * | 4/2008 | Maheshwari | 711/108 |
| 2005/0114393 | A1 * | 5/2005 | Wilson | 707/104.1 |
| 2005/0141519 | A1 * | 6/2005 | Rajgopal et al. | 370/395.32 |

OTHER PUBLICATIONS

M V Ramakrishna, E. Fu, E. Bahcekapili "Efficient Hardware Hashing Functions for High Performance Computers", IEEE Transaction on Computers, Dec. 1997 vol. 46 No. 12, pp. 1378-1381.*
J. P. Wade et al., "A Ternary Content Addressable Search Engine", IEEE Journal of Solid-State Circuits, 24(4):1003-1013, Aug. 1989.*

* cited by examiner

*Primary Examiner*—Pierre-Michel Bataille

(57) ABSTRACT

A method for searching entries in a ternary content addressable memory ("TCAM") device for one or more matches to an input, comprising: (a) providing a first portion of the input to the TCAM and receiving a first indication from the TCAM as to whether the first portion matches one or more of the entries in the TCAM; and, (b) if the first indication is negative, providing a second portion of the input combined with a hashed version of the first portion to the TCAM and receiving a second indication from the TCAM as to whether the second portion combined with the hashed version of the first portion matches one or more of the entries in the TCAM.

33 Claims, 2 Drawing Sheets

METHOD AND SYSTEM FOR CHARACTER STRING SEARCHING

FIELD OF THE INVENTION

This invention relates to the field of data searching, and more specifically, to a method and system for character string searching, such as Uniform Resource Locator ("URL") character string searching, for devices in communications networks.

BACKGROUND OF THE INVENTION

In communications networks, such as Internet Protocol ("IP") based wired and wireless networks, there are an increasing number of network devices whose functionality includes examining Layer 7 information in the Open System Interconnection ("OSI") set of protocols. In the OSI model, there are seven layers, each reflecting a different function that has to be performed in order for program-to-program communication to take place between devices. The seven OSI layers are as follows: Layer 1—physical; Layer 2—data link; Layer 3—network; Layer 4—transport; Layer 5—session; Layer 6—presentation; and, Layer 7—application. Layer 7 supports application and end-user processes. At Layer 7, communication partners are identified, quality of service is identified, user authentication and privacy are considered, and any constraints on data syntax are identified. Everything at this layer is application-specific. Layer 7 provides application services for file transfers, e-mail, and other network software services. Telnet (i.e., terminal emulation) and the File Transfer Protocol ("FTP"), for example, are applications that exist entirely in the application level.

Of particular interest to many network devices is Uniform Resource Locator ("URL") character string information. A URL is the unique address for a file that is accessible on the Internet. A common way to get to navigate to a Web site is to enter the URL of the site's home page file in a Web browser's address line. However, any file within that Web site can also be specified with a URL. Such a file might be a Web page other than the home page, an image file, or a program such as a common gateway interface application or Java™ applet. The URL contains the name of the protocol to be used to access the file resource, a domain name that identifies a specific computer on the Internet, and a pathname (i.e., a hierarchical description that specifies the location of a file in that computer). On the Web, which uses the Hypertext Transfer Protocol ("HTTP"), an example of a URL is "http://www-.somewhere.com/files/file.txt", which specifies the use of a HTTP (Web browser) application, a unique computer named "www.somewhere.com", and the location of a text file or page to be accessed on that computer whose pathname is "/files/file.txt". An example of a URL for a particular image on a Web site is "http://www.somewhere.com/pages/page.gif". A URL for a file meant to be downloaded using the FTP would require that the FTP protocol be specified as in the following example: "ftp://www.somewhere.com/programs/program.ps".

An example of a network device that may make use of URL information is a GPRS Gateway Serving Node ("GGSN"). A GGSN device is an interface between the General Packet Radio Service ("GPRS") wireless data network and other networks such as the Internet or private networks. The use of a GGSN device by a service provider ("SP"), for example, allows billing behaviour to depend upon the Web site being accessed. For example, a GGSN provides the opportunity for SPs to charge their subscribers according to the type of content they wish to access and/or the way they prefer to access this content (e.g., multimedia messaging service ("MMS"), ring-tone downloads, Internet browsing, corporate services, mobile video, etc.).

Another example of a network device that may make use of URL information is a Web switch, also known as a Layer 7 switch, URL switch, Web content switch, or content switch. A Web switch is a load balancing network device that routes traffic to the appropriate Web servers based on the URL of the request.

Typically, a GGSN or Web switch must search for and/or compare URL character string information to perform its function. As network speeds increase, one problem that faces GGSN and Web switch providers is the need to perform URL searches at ever increasing speeds. Characteristics of URL searching include an easily recognized start point, variable length (potentially very long), and case sensitivity. Furthermore, it can be valuable to find the longest matching URL. For example, the device make choose a first action if the URL starts with "xyx*" and a second action if the URL starts with "xvz.abc*". Existing URL search methods include the use of ternary content addressable memory ("TCAM") devices, hashing, and discrete finite automata ("DFA").

A TCAM is a specialized memory device that allows for the simultaneous comparison of input data (or an input pattern) of a given width (common widths include 72, 144, 288 or 576 bits) against a number of entries of the same width. TCAMs typically allow for the configuration of the width of the searches to be performed (e.g., allowing n entries of width w or n/2 entries of width 2 w) and for the partitioning of the search entries to allow different searches to use the same device. The different searches may each have different widths which provides the advantage of only activating part of the TCAM and hence reducing the power consumed by the device. Each bit of each entry in the TCAM may be programmed to match a bit value of 0, 1, or either (i.e., "don't care") of the input data. These three states give the TCAM its name (i.e., "ternary"). The "don't care" value allows matching to values shorter than the full width of the TCAM.

Hashing algorithmically processes the input data to be compared to give a smaller value which can then be used to directly access a memory mapped location, which will then indicate if a match has occurred. One commonly used hashing algorithm is cyclic redundancy checking ("CRC"). The strength of this method is that it uses common memory which is relatively fast, low power, dense, and low cost. For reference, cyclic redundancy checking is a method of checking for errors in data that has been transmitted on a communications link. A sending device applies a 16- or 32-bit polynomial to a block of data that is to be transmitted and appends the resulting CRC code to the block. The receiving end applies the same polynomial to the data and compares its result with the result appended by the sender. If they agree, the data has been received successfully. If not, the sender can be notified to resend the block of data. This application of a polynomial may also be used to match data to known patterns. In this case, the compressed value (or a portion of it) is used to directly look up whether the data matches a pattern, that is, it is used as an address to a stored table. The table entries are configured by compressing the pattern(s) that are being searched for and the corresponding entry is set to indicate the pattern that has been matched. The act of compression (e.g., through the use of a CRC polynomial) means that multiple data patterns may generate the same CRC code. As a result, when a search finds a "hit" it is necessary to confirm that the applied data matches the uncompressed pattern indicated by the hit location. Another possibility is that two patterns that are to be searched for share the same compressed pattern. A further mechanism is required to resolve this situation. As more bits are used in the compressed value, the chances of these collisions occurring decreases, however, the size of the table to be accessed also increases, with each additional bit causing the table size to double.

Discrete finite automata ("DFA") is a pattern matching mechanism based on a finite state machine. It steps through the data that is being compared one portion at a time (e.g., one byte at a time). The value of that portion of the data (e.g., a byte) is used to access a table that indicates the next state of the machine. There is a different table for each state of the machine. A pattern is represented by a series of states, one for each byte of the pattern. If the data causes the machine to follow the states, the pattern is matched. Wildcards, including variable length wildcards, are possible. Different partitioning of the data is possible (e.g., 16 bit units), however, using bytes corresponds to the most common encodings of characters. Larger partitions reduce the rate at which tables need to be accessed (e.g., 16 bit units would half the rate), however, they greatly increase the size of the tables required (e.g., tables for 16 bit units would have 256 times more entries than tables for single byte units).

However, these existing methods have several problems as follows.

One problem with the use of TCAM devices is that these devices are relatively expensive and consume significant amounts of power. As they compare the input data to every programmed entry, increased power consumption is unavoidable. In addition, TCAM searches use fixed width entries. If the input data or pattern to be matched is less than the width of the table in the device, the unused bits are wasted. On the other hand, if the pattern to be matched is wider than what the device supports, multiple searches are required along with a method of associating these searches. Each portion of the pattern will consume one entry in the TCAM (using capacity) and problems may arise when multiple matches occur during a search.

One problem with the use of hashing is that this method requires that the length of the input data or pattern to be matched be known and, in general, fixed. Also, given that the data is being compressed, different values may give the same result which is why most hashing methods have mechanisms to verify that the correct pattern was matched and provide a mechanism to handle the case of two (or more) patterns having the same hashed value. The smaller the hashed value, the higher the rate of collisions. However, the larger the hashed value (i.e., the less the compression) the larger the required table, with each bit doubling the size of the table. Also, hashing does not provide for any form of wildcarding, except if data manipulation can take place before the hashing, which implies that the same wild cards are applied to all patterns.

One problem with the use of DFA is that this method is limited by the need to access a table for each unit (e.g., byte) of the input data. The rate of processing is limited by the time required to access the table in memory, as the result needs to be returned before the next access can be made. Multiple searches on different input data (e.g., URLs from different packets) may occur in parallel to the limit of the memory's bandwidth. Another problem is the amount of memory required. If the DFA operates in units of one byte (for example), each byte of the pattern requires 256 words (i.e., width implementation dependent but at minimum 16 bits and more likely 32 bits). Of course, different patterns may share state tables. Furthermore, the addition of a pattern requires the programming of a table for each byte (i.e., a long pattern requires a lot of writes), if the new pattern shares any state with an existing pattern it is necessary to recognize this and to program the tables accordingly. Similarly, if a pattern is removed, it is necessary to check for shared states and only remove those no longer used.

A need therefore exists for an improved method and system for character string searching. Accordingly, a solution that addresses, at least in part, the above and other shortcomings is desired.

SUMMARY OF THE INVENTION

According to one aspect of the invention, there is provided a method for searching entries in a ternary content addressable memory ("TCAM") device for one or more matches to an input, comprising: (a) providing a first portion of the input to the TCAM and receiving a first indication from the TCAM as to whether the first portion matches one or more of the entries in the TCAM; and, (b) if the first indication is negative, providing a second portion of the input combined with a hashed version of the first portion to the TCAM and receiving a second indication from the TCAM as to whether the second portion combined with the hashed version of the first portion matches one or more of the entries in the TCAM.

The method may further include dividing the input into the first and second portions. In step (b) the first portion may be the first portion through a $(k-1)^{th}$ portion of n portions of the input, the second portion may be a $k^{th}$ portion of the n portions of the input, the first indication may be a $(k-1)^{th}$ indication, the second indication may be a $k^{th}$ indication, k and n may be integers, k may be less than or equal to n, and the method may further include repeating step (b) for k=3 to n or until the $(k-1)^{th}$ indication is positive. The method may further include dividing the input into n portions. The hashed version of the first portion may have a hashed width. The n portions may each have a portion width. The entries in the TCAM may each have an entry width and the sum of the hashed width and the portion width may be less than or equal to the entry width. The input may be a character string. The character string may be a uniform resource locator ("URL"). The method may further include removing case information from the first portion prior to calculation of the hashed version of the first portion. And, the hashed version of the first portion may include a hashed version of the first portion having case information removed and a hashed version of the first portion having case information included.

In accordance with further aspects of the present invention there is provided an apparatus such as a data processing system (e.g., a GGSN device, a network device, a network management system ("NMS"), etc.), a method for adapting this system, as well as articles of manufacture such as a computer readable medium having program instructions recorded thereon for practising the method of the invention.

BRIEF DESCRIPTION OF THE DRAWINGS

Further features and advantages of the embodiments of the present invention will become apparent from the following detailed description, taken in combination with the appended drawings, in which.

Figure 1:
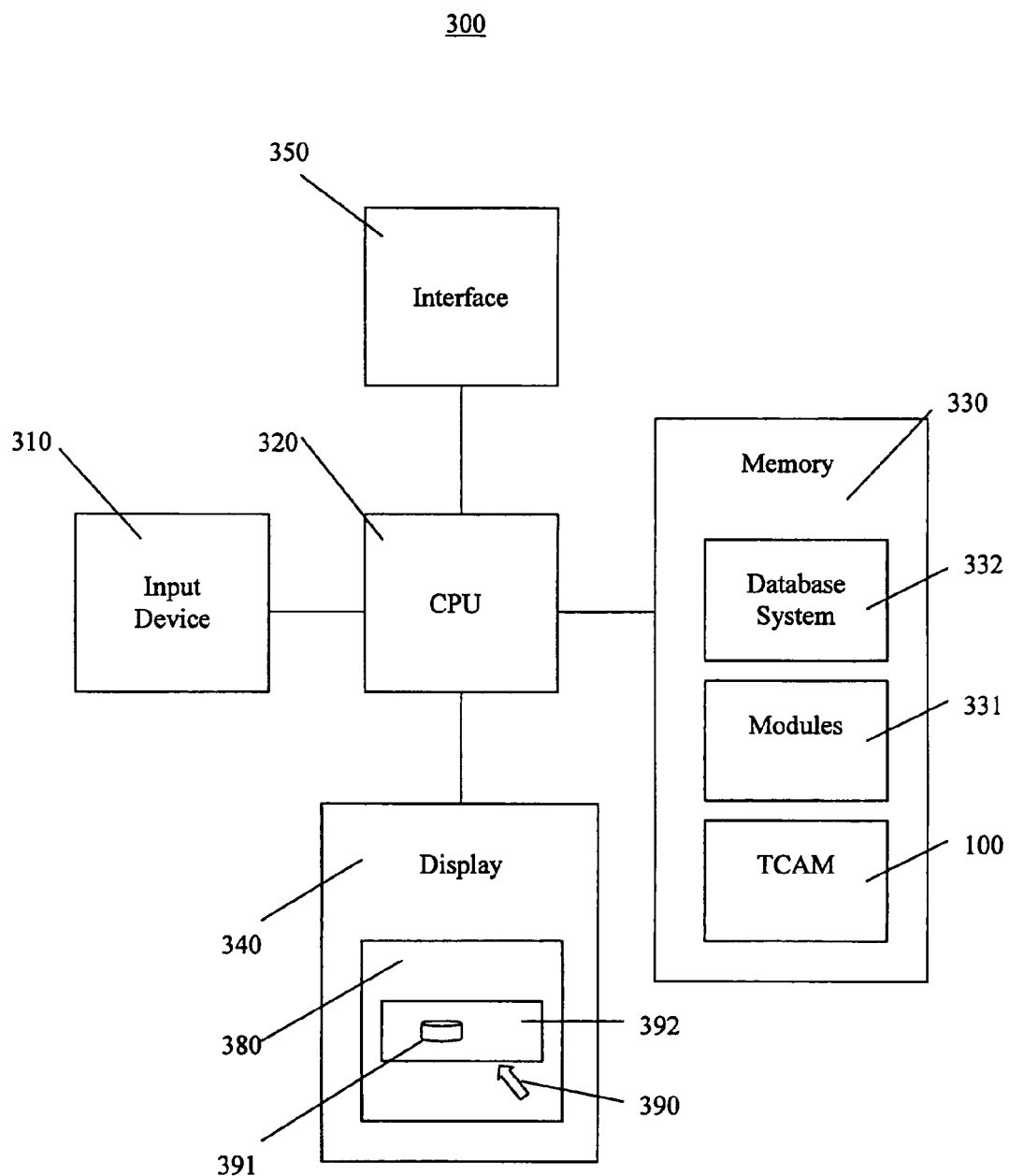
FIG. 1 is a block diagram illustrating a data processing system adapted to implement an embodiment of the invention; and, FIG. 2 is a flow chart illustrating operations of modules within the memory of a data processing system for searching entries in a ternary content addressable memory ("TCAM")

device for one or more matches to an input, in accordance with an embodiment of the invention.

It will be noted that throughout the appended drawings, like features are identified by like reference numerals.

DETAILED DESCRIPTION OF THE PREFERRED EMBODIMENTS

In the following description, details are set forth to provide an understanding of the invention. In some instances, certain software, circuits, structures and techniques have not been described or shown in detail in order not to obscure the invention. The term "data processing system" is used herein to refer to any machine for processing data, including the GGSN, NMS, and network devices described herein. The present invention may be implemented in any computer programming language provided that the operating system of the data processing system provides the facilities that may support the requirements of the present invention. Any limitations presented would be a result of a particular type of operating system or computer programming language and would not be a limitation of the present invention. The present invention may also be implemented in hardware.

FIG. 1 is a block diagram illustrating a data processing system 300 adapted to implement an embodiment of the invention. The data processing system 300 may be a server system or a personal computer ("PC") system and is suitable for operation as or with a GSSN 300, NMS, or other network device. The data processing system 300 includes a central processing unit ("CPU") 320, memory 330, and an interface device 350 and may optionally include an input device 310 and a display 340. The CPU 320 may include dedicated coprocessors and memory devices. The CPU 320 is operatively coupled to memory 330 which stores an operating system (not shown) for general management of the system 300. The memory 330 may include RAM, ROM, disk devices, and databases. The memory 330 may include a variety of storage devices including internal memory and external mass storage typically arranged in a hierarchy of storage as understood to those skilled in the art. The interface device 350 may include one or more network connections. The data processing system 300 is adapted for communicating with other data processing systems (not shown) over a network (not shown) via the interface device 350. The input device 310 may include a keyboard, a mouse, a trackball, or a similar device. And, the display 340 may include a computer screen, terminal device, or a hardcopy producing output device such as a printer or plotter. The CPU 320 of the system 300 is typically coupled to one or more input devices 310 for receiving user commands or queries and for displaying the results of these commands or queries to the user on the display 340. Commands and queries may also be received over a network connection, and results may be transmitted over a network connection. The data processing system 300 may include a database system 332 for storing and accessing network topology and programming information. The database system 332 may include a database management system ("DBMS") and a database and may be stored in the memory 330 of the data processing system 300. The data processing system 300 has stored therein data representing sequences of instructions which when executed cause the method described herein to be performed. Of course, the data processing system 300 may contain additional software and hardware a description of which is not necessary for understanding the invention.

The memory 330 includes at least one ternary content addressable memory ("TCAM") device 100. Each TCAM 100 includes a number of entries (or rows) with each entry having a number of cells. Each cell may assume three logic states, namely, 0, 1, or either (i.e., "don't care"). An input string or key is compared to all the entries in the TCAM 100 in parallel. If the input string matches an entry in the TCAM 100, the TCAM outputs an indication of the match (i.e., of the matching entry). The input string is applied to the TCAM's select lines and the match or matches are output on the TCAM's match lines (e.g., as a match vector). Selection between the matches may be made by a priority encoder (not shown) typically integrated into the TCAM and coupled to the match lines and/or by a module 331 operating in the data processing system 300. The entries are preloaded into the TCAM 100 by, for example, a module 331 operating on the data processing system 300 which may access the database system 332, etc.

Optionally, a user may interact with the data processing system 300 and its hardware and software modules 331 using an optional graphical user interface ("GUI") 380. The GUI 380 may be used for monitoring, managing, and accessing the data processing system 300. GUIs are supported by common operating systems and provide a display format which enables a user to choose commands, execute application programs, manage computer files, and perform other functions by selecting pictorial representations known as icons, or items from a menu through use of an input or pointing device such as a mouse 310. In general, a GUI is used to convey information to and receive commands from users and generally includes a variety of GUI objects or controls, including icons, toolbars, drop-down menus, text, dialog boxes, buttons, and the like. A user typically interacts with a GUI 380 presented on a display 340 by using an input or pointing device (e.g., a mouse) 310 to position a pointer or cursor 390 over an object (e.g., an icon) 391 and by "clicking" on the object 391.

Typically, a GUI based system presents application, system status, and other information to the user in "windows" appearing on the display 340. A window 392 is a more or less rectangular area within the display 340 in which a user may view an application or a document. Such a window 392 may be open, closed, displayed full screen, reduced to an icon, increased or reduced in size, or moved to different areas of the display 340. Multiple windows may be displayed simultaneously, such as: windows included within other windows, windows overlapping other windows, or windows tiled within the display area.

Thus, the data processing system 300 includes computer executable programmed instructions for directing the system 300 to implement the embodiments of the present invention. The programmed instructions may be embodied in one or more hardware modules or software modules 331 resident in the memory 330 of the data processing system 300. Alternatively, the programmed instructions may be embodied on a computer readable medium (such as a CD disk or floppy disk) which may be used for transporting the programmed instructions to the memory 330 of the data processing system 300. Alternatively, the programmed instructions may be embedded in a computer-readable signal or signal-bearing medium that is uploaded to a network by a vendor or supplier of the programmed instructions, and this signal or signal-bearing medium may be downloaded through an interface (e.g., 350) to the data processing system 300 from the network by end users or potential buyers.

As mentioned above, in communications networks, such as IP based wired and wireless networks, there are an increasing number of network devices such as GGSNs 300 whose functionality includes examining Layer 7 information such as URL character string information. The present invention is directed to a method for high speed pattern matching which is useful for GGSNs 300 and other network devices. As will be described below, the present invention provides a method for high speed pattern matching that is a hybrid of hashing and TCAM search techniques. Advantageously, this method provides faster operation and easier addition/removal of database entries than that of existing techniques.

According to one embodiment, a method for searching entries in a TCAM 100 is provided. The method may be considered as a hybrid of hashing and TCAM search techniques. First, the input data (or the input) to be searched or compared is partitioned into portions of fixed width.

Next, the first portion of the input data is used as a key to search in the TCAM's entries, the remaining portion(s) of the input having some fixed value. If a match is found, search operations may stop or a result associated with the match or the location of the match may indicate that a longer match should be searched for. The decision to proceed with searching for a longer match may be made by modules 331 operating in the data processing system 300.

If a match is not found, the first portion of the input data is hashed and the resulting hashed version of the first portion is used as the first part of the key, while the second part of the key is composed of a second portion of the data that is not hashed. The TCAM 100 is then searched using this combined key. As with the first search, a match may result in the termination of the search or the search may continue to look for a longer match. For reference, hashing is the transformation of a string of characters into a usually shorter fixed-length value or key that represents the original string. The transformation is performed in accordance with a hashing algorithm or function. For example, in the case of database searching, hashing is used to index and retrieve items because it is faster to find the item using the shorter hashed key than to find it using the original value. A search for a string of characters would first consist of computing the hashed value (using the same hashing algorithm or function used to store the string) and then comparing for a match using the hashed value. While the original string may consist of, for example, 24 bytes, the hashed value (or hashed version of the original string) may consist of, for example, 4 bytes. The use of the compressed value allows the matching of a larger pattern while using a matching mechanism with a limited pattern width capacity. Examples of hashing algorithms or functions are the 16 bit (i.e., 2 byte) and 32 bit (i.e., 4 byte) cyclic redundancy check ("CRC") codes.

If no match is found, hashing operations continue to generate a hashed version of the first and second portions of the data. A new combined key is generated using this hashed version and the next (or third) portion of the data.

This method continues until a match is found that does not require additional searching (as decided by modules 331) or until the end of the input data is reached (e.g., the end of the URL string or other character string is reached) or until the amount of the input data compared exceeds the length of the longest pattern entry in the table (i.e., TCAM).

Note that the above method assumes that a starting point for the input data or pattern has been determined whether by parsing the input data or by finding a well-known pattern (e.g., "http://"). This is a limitation that is shared by existing TCAM and hashing based solutions.

According to one embodiment, the above method may be extended by removing case information (i.e., upper case character indications, lower case character indications, etc.) from portions of the input data before they are hashed. For example, all upper case characters may be changed to lower case characters (or vice versa). However, this should not be performed on the portion of the key that is not hashed. By use of the "don't care" capability of the TCAM 100, case sensitivity can be accommodated in the entries stored in the TCAM 100.

According to another embodiment, two hashed values may be calculated based on portions of the input data with case information removed and based on portions of the input data with case information included. The case sensitive hashed value can be much more compressed than the case insensitive hashed value, given that the probability of a collision of two patterns only differing in case is greatly reduced. In this embodiment, the key may consist of both hashed values and the portion of the input data that is not hashed. If a programmed entry or pattern in the TCAM 100 is case insensitive, the case sensitive hashed value may be coded with "don't cares".

Thus, the present invention provides a method for comparing input data to entries or patterns stored in a TCAM 100. The basic steps of the method are as follows: (a) partitioning the input data into portions of fixed width; (b) searching the TCAM 100 using the first portion of input data as a key; (c) ending the comparison and returning a result responsive to a match result of the search indicating that the comparison should end; otherwise, (d) hashing the first portion of the input data, which represents a first part of a search key, and combining it with the second portion of the input data, which represents a second part of the search key, responsive to a match result indicating that a longer match should be sought; (e) searching the TCAM 100 using the combined search key; and, (f) repeating steps (c) to (e) for each successive portion of the input data until either the end of the input data is reached or a match result indicates that the comparison should end, where in step (d) the first part of the search key is formed from hashed values of all previous portions of the input data and the second part of the search key is the successive portion of data of the present iteration through steps (c) to (e). In addition, the method may include processing the portions of the input data before hashing them (e.g., removing upper/lower case information).

The present invention provides several advantages. First, the invention supports matching of patterns of arbitrary length. On the other hand, pure TCAM searches are limited by the configured width of the device where greater lengths require mechanisms to combine multiple matches either performed on additional devices or performed at another time on the same device. Second, the invention allows for searches to take place with intermediate hashed values as the input data is processed. On the other hand, traditional hashing requires a known length for the candidate data which would require that a search take place for every length of possible interest of the input data in order to support different pattern lengths. Third, the invention supports a wide calculated hashed value (hence minimizing collisions) without requiring inordinate memory space. Fourth, the invention is significantly faster in operation than DFA techniques. For example, the addition or removal of entries from the TCAM 100 has little effect on other entries. However, with DFA techniques, states may be shared and hence entries may be dependent on one another. Fifth, the invention makes more efficient use of TCAMs. Sixth, the invention supports the use of wildcards as well as current TCAM and hashing based solutions. Seventh, the invention increases the rate at which deep packet inspection (e.g., for URLs, Layer 7 information, etc.) can be performed for billing and related applications. Eighth, the invention allows for pattern matching at rates that may exceed 2.5 Gbps.

Figure 2:
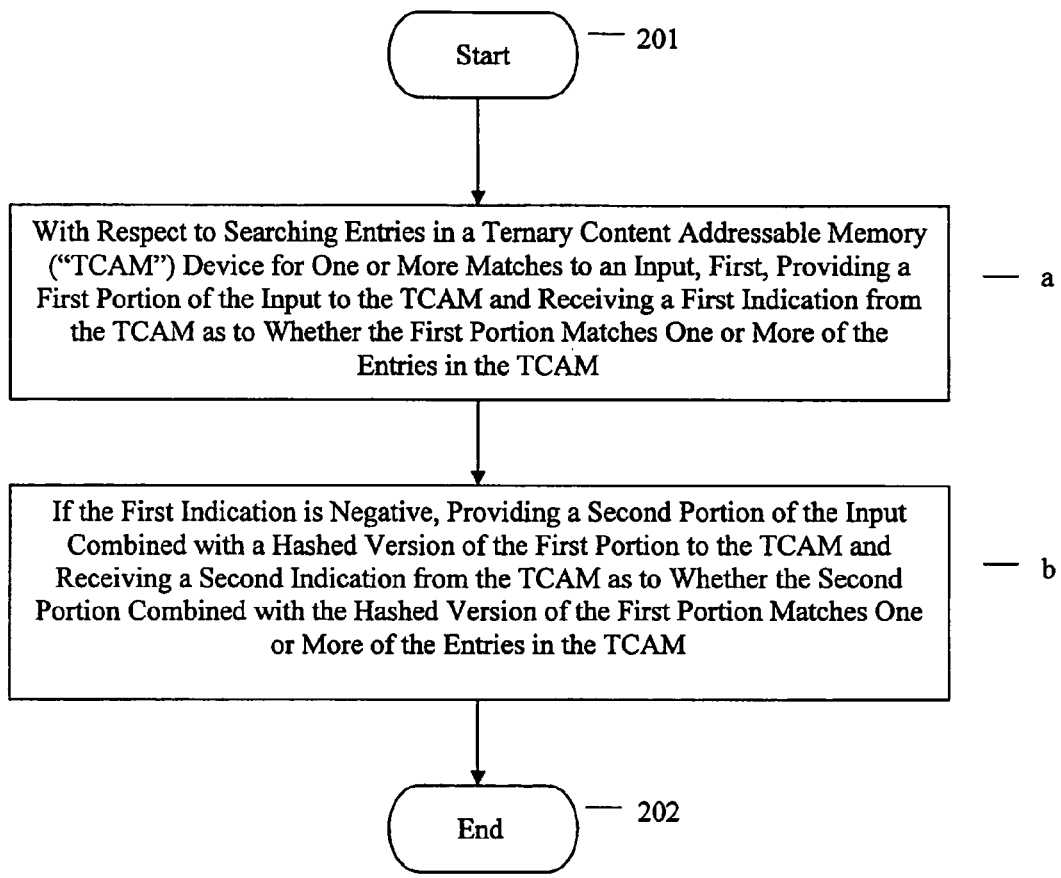

The above described method may be summarized with the aid of a flowchart. FIG. 2 is a flow chart illustrating operations 200 of modules 331 within the memory 330 of a data processing system (e.g., a GGSN 300) for searching entries in a ternary content addressable memory ("TCAM") device 100 for one or more matches to an input, in accordance with an embodiment of the invention.

At step 201, the operations 200 start.

At step (a), a first portion of the input is provided to the TCAM 100 and a first indication is received from the TCAM 100 as to whether the first portion matches one or more of the entries in the TCAM 100.

At step (b), if the first indication is negative, a second portion of the input combined with a hashed version of the first portion is provided to the TCAM 100 and a second indication is received from the TCAM 100 as to whether the second portion combined with the hashed version of the first portion matches one or more of the entries in the TCAM 100.

At step 202, the operations 200 end.

The method may further include dividing the input into the first and second portions. In step (b) the first portion may be the first portion through a $(k-1)^{th}$ portion of n portions of the input, the second portion may be a $k^{th}$ portion of the n portions of the input, the first indication may be a $(k-1)^{th}$ indication, the second indication may be a $k^{th}$ indication, k and n may be integers, k may be less than or equal to n, and the method may further include repeating step (b) for k=3 to n or until the $(k-1)^{th}$ indication is positive. The method may further include dividing the input into n portions. The hashed version of the first portion may have a hashed width (e.g., a constant 4 bytes from a 32-bit CRC). The n portions may each have a portion width (e.g., a constant 24 bytes except possibly for the last portion). The entries in the TCAM 100 may each have an entry width (e.g., 36 bytes, 72 bytes, etc.) and the sum of the hashed width and the portion width may be less than or equal to the entry width. The input may be a character string. The character string may be a uniform resource locator ("URL"). The method may further include removing case information from the first portion prior to calculation of the hashed version of the first portion. And, the hashed version of the first portion may include a hashed version of the first portion having case information removed and a hashed version of the first portion having case information included.

According to one embodiment, the above described method may be implemented by a network device 300 or NMS 300 rather than by a GGSN device 300 or in combination with a GGSN device 300.

While this invention is primarily discussed as a method, a person of ordinary skill in the art will understand that the apparatus discussed above with reference to a data processing system 300, may be programmed to enable the practice of the method of the invention. Moreover, an article of manufacture for use with a data processing system 300, such as a prerecorded storage device or other similar computer readable medium including program instructions recorded thereon, may direct the data processing system 300 to facilitate the practice of the method of the invention. It is understood that such apparatus and articles of manufacture also come within the scope of the invention.

In particular, the sequences of instructions which when executed cause the method described herein to be performed by the data processing system 300 can be contained in a data carrier product according to one embodiment. This data carrier product can be loaded into and run by the data processing system 300. In addition, the sequences of instructions which when executed cause the method described herein to be performed by the data processing system 300 can be contained in a computer software product (e.g., software modules) according to one embodiment. This computer software product can be loaded into and run by the data processing system 300. Furthermore, the sequences of instructions which when executed cause the method described herein to be performed by the data processing system 300 can be contained in an integrated circuit product (e.g., hardware modules) including a coprocessor or memory according to one embodiment. This integrated circuit product can be installed in the data processing system 300. Moreover, the sequences of instructions which when executed cause the method described herein to be performed can be contained in an integrated circuit product (e.g., hardware modules, a field programmable gate array ("FPGA"), an application specific integrated circuit ("ASIC"), etc.) according to one embodiment. This integrated circuit product can be installed in the data processing system 300.

The embodiments of the invention described above are intended to be exemplary only. Those skilled in this art will understand that various modifications of detail may be made to these embodiments, all of which come within the scope of the invention.

What is claimed is:

1. A method for searching entries in a ternary content addressable memory ("TCAM") device for one or more matches to an input, comprising:
   (a) providing a first portion of the input to the TCAM and receiving a first indication from the TCAM as to whether the first portion matches one or more of the entries in the TCAM; and,
   (b) if the first indication is negative, providing a second portion of the input combined with a hashed version of the first portion to the TCAM and receiving a second indication from the TCAM as to whether the second portion combined with the hashed version of the first portion matches one or more of the entries in the TCAM.

2. The method of claim 1 and further comprising dividing the input into the first and second portions.

3. The method of claim 2 wherein in step (b) the first portion is the first portion through a $(k-1)^{th}$ portion of n portions of the input, the second portion is a $k^{th}$ portion of the n portions of the input, the first indication is a $(k-1)^{th}$ indication, the second indication is a $k^{th}$ indication, k and n are integers, k is less than or equal to n, and further comprising repeating step (b) for k=3 to n or until the $(k-1)^{th}$ indication is positive.

4. The method of claim 3 and further comprising dividing the input into n portions.

5. The method of claim 4 wherein the hashed version of the first portion has a hashed width.

6. The method of claim 5 wherein the n portions each have a portion width.

7. The method of claim 6 wherein the entries in the TCAM each have an entry width and wherein the sum of the hashed width and the portion width is less than or equal to the entry width.

8. The method of claim 1 wherein the input is a character string.

9. The method of claim 8 wherein the character string is a uniform resource locator ("URL").

10. The method of claim 8 and further comprising removing case information from the first portion prior to calculation of the hashed version of the first portion.

11. The method of claim 8 wherein the hashed version of the first portion includes a hashed version of the first portion having case information removed and a hashed version of the first portion having case information included.

12. A circuit for searching entries in a ternary content addressable memory ("TCAM") device for one or more matches to an input, comprising:
  modules within the circuit and coupled to the TCAM, the modules including:
  a module for (a) providing a first portion of the input to the TCAM and receiving a first indication from the TCAM as to whether the first portion matches one or more of the entries in the TCAM; and,
  a module for (b), if the first indication is negative, providing a second portion of the input combined with a hashed version of the first portion to the TCAM and receiving a second indication from the TCAM as to whether the second portion combined with the hashed version of the first portion matches one or more of the entries in the TCAM.

13. The circuit of claim 12 and further comprising a module for dividing the input into the first and second portions.

14. The circuit of claim 13 wherein in the module for step (b), the first portion is the first portion through a $(k-1)^{th}$ portion of n portions of the input, the second portion is a $k^{th}$ portion of the n portions of the input, the first indication is a $(k-1)^{th}$ indication, the second indication is a $k^{th}$ indication, k and n are integers, k is less than or equal to n, and wherein the module for step (b) further comprises a module for repeating step (b) for k=3 to n or until the $(k-1)^{th}$ indication is positive.

15. The circuit of claim 14 and further comprising a module for dividing the input into n portions.

16. The circuit of claim 15 wherein the hashed version of the first portion has a hashed width.

17. The circuit of claim 16 wherein the n portions each have a portion width.

18. The circuit of claim 17 wherein the entries in the TCAM each have an entry width and wherein the sum of the hashed width and the portion width is less than or equal to the entry width.

19. The circuit of claim 12 wherein the input is a character string.

20. The circuit of claim 19 wherein the character string is a uniform resource locator ("URL").

21. The circuit of claim 19 further comprising a module for removing case information from the first portion prior to calculation of the hashed version of the first portion.

22. The circuit of claim 19 wherein the hashed version of the first portion includes a hashed version of the first portion having case information removed and a hashed version of the first portion having case information included.

23. A system for searching entries in a ternary content addressable memory ("TCAM") device for one or more matches to an input, comprising:
  a processor coupled to memory and to the TCAM; and,
  modules within the memory and executed by the processor, the modules including:
  a module for (a) providing a first portion of the input to the TCAM and receiving a first indication from the TCAM as to whether the first portion matches one or more of the entries in the TCAM; and,
  a module for (b), if the first indication is negative, providing a second portion of the input combined with a hashed version of the first portion to the TCAM and receiving a second indication from the TCAM as to whether the second portion combined with the hashed version of the first portion matches one or more of the entries in the TCAM.

24. The system of claim 23 and further comprising a module for dividing the input into the first and second portions.

25. The system of claim 24 wherein in the module for step (b), the first portion is the first portion through a $(k-1)^{th}$ portion of n portions of the input, the second portion is a $k^{th}$ portion of the n portions of the input, the first indication is a $(k-1)^{th}$ indication, the second indication is a $k^{th}$ indication, k and n are integers, k is less than or equal to n, and wherein the module for step (b) further comprises a module for repeating step (b) for k=3 to n or until the $(k-1)^{th}$ indication is positive.

26. The system of claim 25 and further comprising a module for dividing the input into n portions.

27. The system of claim 26 wherein the hashed version of the first portion has a hashed width.

28. The system of claim 27 wherein the n portions each have a portion width.

29. The system of claim 28 wherein the entries in the TCAM each have an entry width and wherein the sum of the hashed width and the portion width is less than or equal to the entry width.

30. The system of claim 23 wherein the input is a character string.

31. The system of claim 30 wherein the character string is a uniform resource locator ("URL").

32. The system of claim 30 further comprising a module for removing case information from the first portion prior to calculation of the hashed version of the first portion.

33. The system of claim 30 wherein the hashed version of the first portion includes a hashed version of the first portion having case information removed and a hashed version of the first portion having case information included.

* * * * *